United States Patent [19]
Batra et al.

[11] Patent Number: 5,385,854
[45] Date of Patent: Jan. 31, 1995

[54] METHOD OF FORMING A SELF-ALIGNED LOW DENSITY DRAIN INVERTED THIN FILM TRANSISTOR

[75] Inventors: Shubneesh Batra, Boise; Monte Manning, Kuna, both of Id.

[73] Assignee: Micron Semiconductor, Inc., Boise, Id.

[21] Appl. No.: 92,295

[22] Filed: Jul. 15, 1993

[51] Int. Cl.⁶ .......................... H01L 21/265
[52] U.S. Cl. ......................... 437/41; 437/27; 437/913
[58] Field of Search .............. 437/40, 41, 36, 27, 437/28, 29, 30, 36, 915, 56, 57, 44, 913; 148/DIG. 150

[56] References Cited

U.S. PATENT DOCUMENTS

| | | | |
|---|---|---|---|
| 4,372,033 | 2/1983 | Chiao | 437/36 |
| 4,393,578 | 7/1983 | Cady et al. | 148/DIG. 150 |
| 4,417,385 | 11/1983 | Temple | 437/36 |
| 4,933,994 | 6/1990 | Orban | 437/57 |
| 5,151,374 | 9/1992 | Wu | 437/40 |
| 5,198,379 | 3/1993 | Adan | 437/46 |
| 5,214,295 | 5/1993 | Manning | 437/41 |

FOREIGN PATENT DOCUMENTS

| | | | |
|---|---|---|---|
| 57130471 | 8/1982 | Japan | 437/44 |
| 0364932 | 3/1991 | Japan | 437/44 |

Primary Examiner—Brian E. Hearn
Assistant Examiner—Michael Trinh
Attorney, Agent, or Firm—Kevin D. Martin

[57] ABSTRACT

A process for forming a thin film transistor having a lightly doped drain which is self-aligned with the transistor channel. A transistor gate is formed over a first dielectric layer, and a second dielectric layer is formed over the transistor gate. A layer of polycrystalline silicon (poly) is formed over said second dielectric layer, and the poly layer can be optionally doped with a P-type or N-type dopant to adjust the threshold voltage of the transistor. Next, an implant masking layer is formed over the gate, and has an etch mask thereupon. The exposed implant masking layer is removed, and in one embodiment the etch mask is undercut during the same etch to remove portions of the implant masking layer from under the etch mask. The exposed poly is doped with a P-type dopant. The etch mask is removed and the exposed poly is again doped with a P-type dopant to form the lightly doped drain using the implant mask to self-align the lightly doped drain with the channel region. Other embodiments include the formation of an N-type metal oxide semiconductor and a separate undercut etch.

26 Claims, 2 Drawing Sheets

METHOD OF FORMING A SELF-ALIGNED LOW DENSITY DRAIN INVERTED THIN FILM TRANSISTOR

FIELD OF THE INVENTION

This invention relates to the field of semiconductor manufacture. More specifically, a method of forming source, drain, and channel regions in a thin film transistor is described. The thin film transistor can be used to form any semiconductor device, for example random access memory, microprocessors, nonvolatile memory, and other semiconductor devices.

BACKGROUND OF THE INVENTION

A cell for a static random access memory (SRAM) is characterized by operation in one of two mutually exclusive and cell-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" memory cell operating state. A low or reset output voltage usually represents a binary value of zero, and a high or set output voltage represents a binary value of one.

A static memory cell is said to be bi-stable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The operation of a static memory cell is in contrast to other types of memory cells, such as for dynamic random access memory (DRAM), which do not have stable operating states. A dynamic memory cell can be programmed to store a voltage which represents one of two binary values, but requires periodic reprogramming or "refreshing" to maintain this voltage for more than a few milliseconds. A dynamic memory cell has no feedback to maintain a stable output voltage. Without refreshing, the output of a dynamic memory cell will drift toward intermediate or indeterminate voltages, effectively resulting in loss of data.

Dynamic memory cells are used in spite of this limitation because of the significantly greater packaging densities which can be attained. For instance, a dynamic memory cell can be fabricated with a single MOSFET transistor, rather than the six transistors typically required in a static memory cell. Because of the significantly different architectural arrangements and functional requirements of static and dynamic memory cells and circuits, static memory design has developed along a different path than has the design of dynamic memories.

Ongoing efforts in SRAM circuitry to improve active loads has brought about the development of thin film transistors and inverted TFTs in attempts to provide low leakage current as well as high noise immunity. A process for forming an inverted TFT design is shown in FIGS. 1-3. As shown in FIG. 1, a wafer substrate 10, usually silicon, has a layer of dielectric 12, usually an oxide, and a patterned gate region 14, usually doped polycrystalline silicon (poly), formed thereupon. A second dielectric layer 16 isolates the gate region 14 from a second poly layer 18. The wafer surface is then doped, for example with an N-type dopant such as phosphorous, to result in an N-type poly layer 18.

As shown in FIG. 2, a mask 20, such as a resist, is patterned over the gate region 14 and poly layer 18 is again doped, for example with a P-type dopant such as boron, thereby lightly counterdoping the exposed poly regions 22 while leaving the poly regions 24 covered by the mask 20 N-type.

Referring to FIG. 3, a second mask 30 is patterned over a portion of the gate region 14, and the wafer surface is positively doped a second time, thereby resulting in the second poly layer having three differentially doped regions, highly doped P-type regions 32, lightly doped P-type regions 34, and an N-type region 36. Region 34a will form a transistor source LDD, and 34b will form a transistor drain LDD, while region 36 will provide a transistor channel region for the gate 14.

This process can have misalignment problems as it requires two masks, and therefore two patterning steps. If mask 20 or mask 30 is misaligned to the gate 14, the lightly doped source-drain regions can be misaligned, thereby creating a transistor having unfavorable electrical properties and lower yields. A need remains for a TFT formation process which has reduced problems of misalignment.

SUMMARY OF THE INVENTION

An object of the inventive process is to provide a method of forming a TFT source, drain, and channel region by using a single mask to provide the three differently doped regions.

This object of the invention is realized by the use of an undercut etch technique. First, the structure of FIG. 1 is formed and optionally doped to adjust the threshold voltage with either a P-type or an N-type dopant. Next, a implant masking layer of oxide, or other material that can be selectively etched with respect to polycrystalline silicon, is formed over the wafer surface, and a mask is formed over the oxide layer. The exposed oxide is removed, thereby aligning the mask and the underlying oxide layer with the transistor gate. The poly layer is then doped with a first P-type dopant which forms the heavily doped TFT source/drain regions, then an isotropic dielectric etch is performed which undercuts the oxide underlying the resist while not significantly affecting the resist or the exposed poly. The resist is removed, and the poly layer is doped with a second P-type dopant, which lightly dopes the source-drain LDD regions. The threshold adjust implant can be performed either before or after the undercut and source-drain implants. If it is performed after, the implant masking layer must first be removed. If it is performed before, the implant masking layer is removed at this point, and wafer processing continues in accordance with known techniques.

Other objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
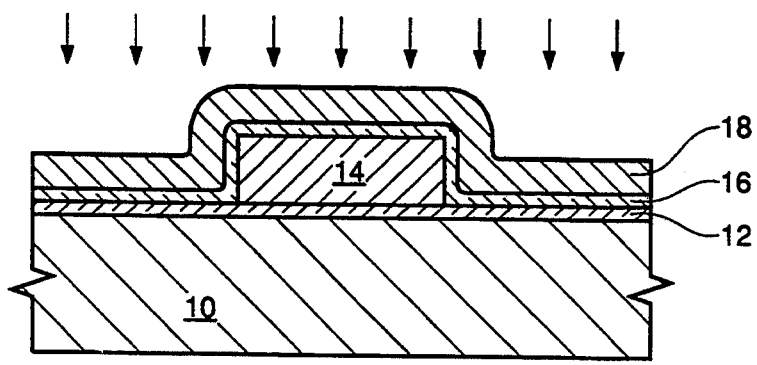
FIG. 1 shows a first doping step in the conventional formation of a thin film transistor having a lightly doped drain.
Figure 2:
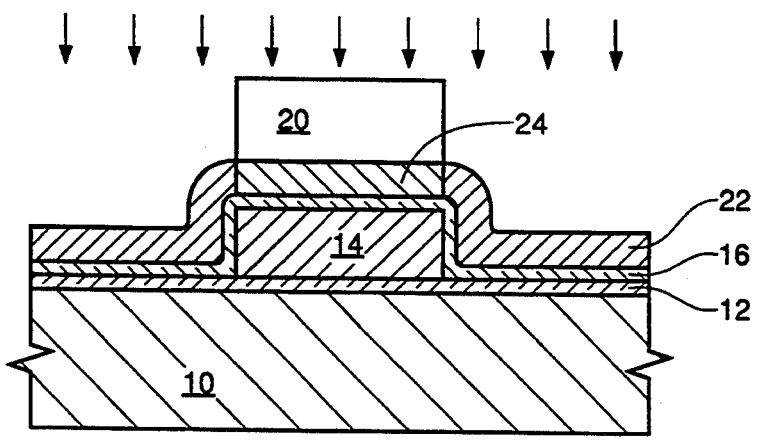
FIG. 2 shows the FIG. 1 structure with the addition of a first mask and a second doping step.
Figure 3:
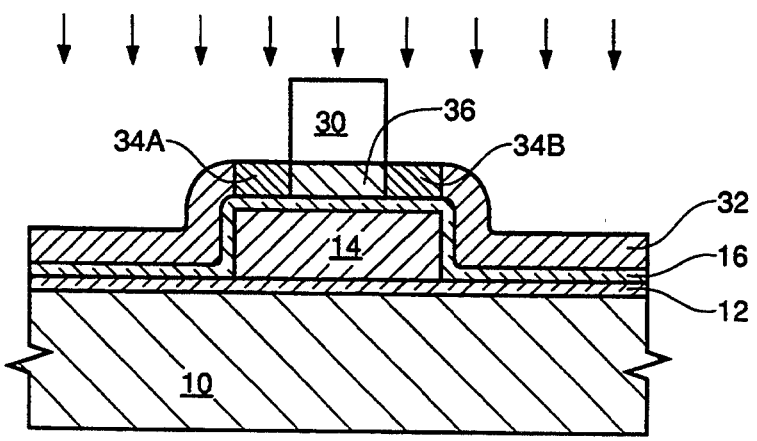
FIG. 3 shows the FIG. 2 structure with the addition of a second mask and a third doping step.

In accordance with one embodiment of the invention, a wafer is fabricated using methods known in the art to produce the structure of FIG. 1. Dielectric layer 16, for example an oxide having a thickness of about 250 Å, and a semiconductor layer 18, for example polycrystalline silicon having a thickness of about 500 Å, would function sufficiently for the invention, and other materials and thicknesses may also perform adequately. This structure though shown over only a silicon substrate, can also be formed over other devices or structures as well as on nonplanar topology. The structure may also be modified with processing to make the topology less severe prior to TFT gate dielectric 16 deposition. This can be accomplished by adding sidewall spacers adjacent to gate poly 14, or by depositing oxide and planarizing and exposing the gate poly 14 such that the surface is essentially planar prior to TFT gate dielectric 16 deposition.

Next, an optional doping of layer 18 may be performed to adjust the characteristics of the TFT such as to adjust the threshold voltage (voltage adjust implant). The doping can be either P-type or N-type if a P-type metal oxide semiconductor (PMOS) device is being formed. For example, an implantation of layer 18 using phosphorous or arsenic at a dose of about $4.6E12$ ions/cm$^2$ can be used to adjust the threshold voltage.

Figure 4:
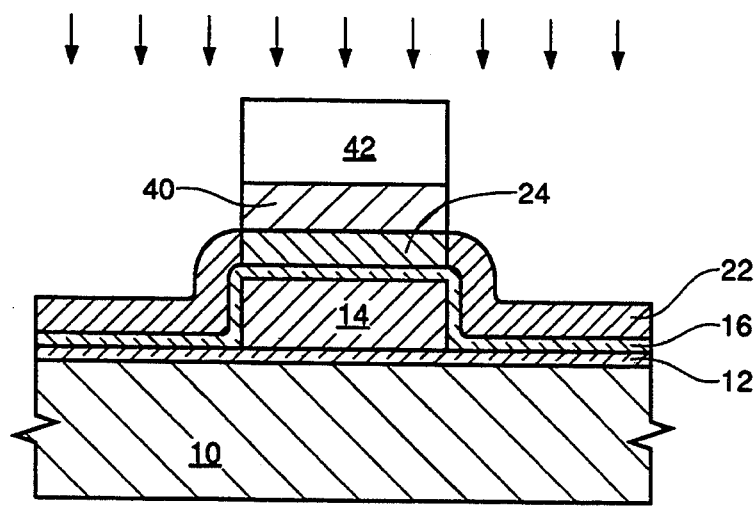
FIG. 4 is a second doping step in the inventive process after the first doping step of FIG. 1 and the addition of a dielectric and a mask.

Next, an implant masking layer such as an oxide is formed over layer 18. This implant masking layer must be a material that can be selectively removed from the underlying semiconductor material without damaging the semiconductor material and must be thick enough to prevent subsequent source/drain implants from entering the TFT channel 36. A mask 42 such as photoresist is formed over a portion of the implant masking layer 40 and over the transistor gate 14. If plasma oxide is used, a thickness of 2000 Å would be sufficient. The exposed oxide is removed to result in the structure of FIG. 4, having oxide 40 and photoresist 42. The oxide 40 can be undercut at this point by continuing the etch, or stopped as shown in FIG. 4 and undercut as described below. In either case the wafer surface is doped with a P-type dopant, for example boron using a BF$_2$ dopant implant. A BF$_2$ dose of about $5.0E14$ ions/cm$^2$ would be sufficient. This counterdopes the exposed N-type poly regions to form heavily doped P-type regions 22, while leaving the N-type region 24 under the patterned oxide layer 40.

Figure 5:
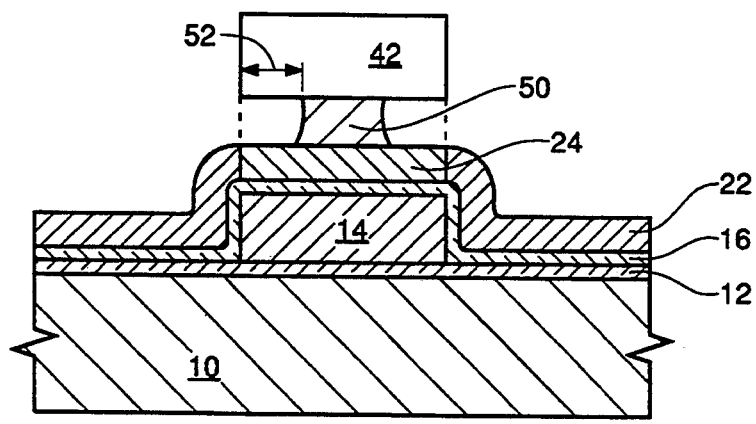
FIG. 5 shows the FIG. 4 structure after an isotropic undercut etch of the oxide layer underlying the mask.

If the implant mask 40 has not been previously undercut as described above, an isotropic etch selective to the TFT poly layer 22 is performed, such as by using a wet hydrofluoric acid etch or a highly isotropic dry etch. The etch narrows the dielectric 40 which is sandwiched between the N-type region 24 and the mask 42. This etch is highly controllable, and allows for the removal of a desired amount of dielectric 40, to result in the structure of FIG. 5. Dielectric 50 has receded from the edge of the P-type region 22 and will function as an implant mask. The drain offset is determined by the amount of undercut 52.

Figure 6:
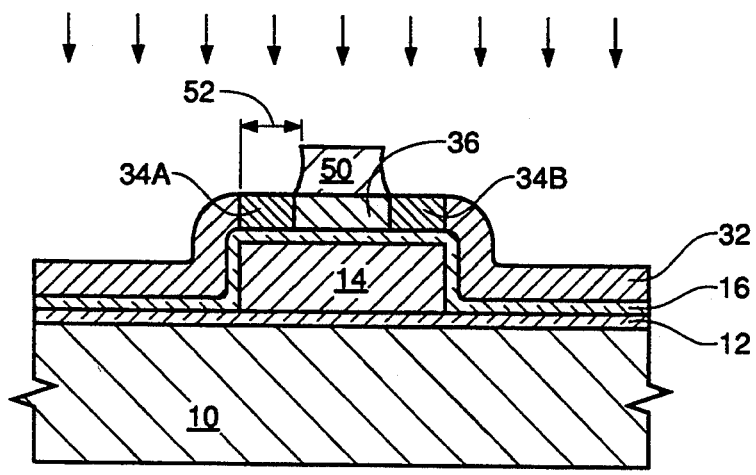
FIG. 6 shows the FIG. 5 structure after the removal of the mask and the addition of a third doping step.

The resist mask 42 is then removed and second P-type doping step is performed over the wafer surface, for example with boron using a BF$_2$ dopant implant at a dose of about $5.0E12$ ions/cm$^2$ using oxide 50 as an implant mask. As shown in FIG. 6, this forms regions 34$a$ and 34$b$ which are lightly doped P-type, region 36 which is doped N-type, and regions 32 which are highly doped P-type.

Finally, dielectric 50 can be removed, thereby resulting in a LDD TFT with the LDD offset regions 34$a$ and 34$b$ which are self-aligned to the channel 36.

The inventive process achieves a self-aligned lightly doped drain (LDD) structure with a single mask step. It further improves the transistor performance by lowering the drain field which reduces OFF current.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, other materials and doping concentrations may function sufficiently. Also, it is conceivable that an N-channel device may also be formed with modifications of the described process by artisans of skill in the art from the description herein. It is therefore contemplated that the appended claims will cover any such modifications or embodiments as fall within the true scope of the invention.

What is claimed is:

1. A process for forming a semiconductor device having an inverted thin film transistor, comprising the following steps:
   a) forming a first dielectric layer over a semiconductor substrate;
   b) forming a thin film transistor gate over said first dielectric layer;
   c) forming a second dielectric layer over said transistor gate;
   d) forming a semiconductor layer over said second dielectric layer and over said thin film gate;
   e) forming an implant masking layer over said semiconductor layer;
   f) forming an etch mask layer over said transistor gate and over a portion of said implant masking layer, thereby covering portions of said implant masking layer and leaving portions of said implant masking layer exposed;
   g) removing said exposed portions of said implant masking layer thereby forming exposed portions of said semiconductor layer;
   h) doping said exposed portions of said semiconductor layer;
   i) undercutting said etch mask to remove a portion of said implant masking layer from under said etch mask and further exposing said semiconductor layer; and j) subsequent to step i), doping said semiconductor layer exposed during step i), wherein said doping steps form thin film transistor source and drain regions, and said source and drain regions and said gate form portions of an inverted thin film transistor device.

2. The process of claim 1 wherein steps g) and i) are performed during a single etch step.

3. The process of claim 1 further comprising the step of performing a voltage adjust implant on said semiconductor layer by doping said semiconductor layer.

4. The process of claim 3 wherein said voltage adjust implant dopes said semiconductor layer with an N-type dopant at a dose of 4.6E12 ions/cm$^2$, said step h) dopes said semiconductor layer with a P-type dopant at a dose of 5.0E14 ions/cm$^2$, and said step j) dopes said semiconductor layer with a P-type dopant at a dose of 5.0E12 ions/cm$^2$.

5. The process of claim 1, further comprising the step of removing said etch mask between steps i) and j).

6. The process of claim 5, further comprising the step of removing said implant masking layer after step j).

7. The process of claim 6, wherein said implant masking layer comprises plasma oxide having a thickness of 2000 Å.

8. The process of claim 1 wherein said step i) comprises the use of hydrofluoric acid as an etchant to undercut said etch mask.

9. The process of claim 1 wherein said step i) comprises the use of a plasma as an etchant to undercut said etch mask.

10. A process for forming an inverted lightly doped drain thin film transistor for a static random access memory device, comprising the following steps:
a) forming a first dielectric layer over a semiconductor substrate;
b) forming a thin film transistor gate over said first dielectric layer;
c) forming a second dielectric layer over said transistor gate;
d) forming a semiconductor layer over said second dielectric layer and over said thin film gate;
e) forming an implant masking layer over said semiconductor layer;
f) forming an etch mask layer over said transistor gate and over a portion of said implant masking layer, thereby covering portions of said implant masking layer and leaving portions of said implant masking layer exposed;
g) removing said exposed portions of said implant masking layer thereby forming exposed portions of said semiconductor layer;
h) doping said exposed portions of said semiconductor layer;
i) undercutting said etch mask to remove a portion of said implant masking layer from under said etch mask and further exposing said semiconductor layer; and
j) subsequent to step i), doping said semiconductor layer exposed during step i);

wherein said doping steps form thin film transistor source and drain regions, and said source and drain regions and said gate form portions of an inverted thin film transistor device.

11. The process of claim 10 wherein steps g) and i) are performed during a single etch step.

12. The process of claim 10 further comprising the step of performing a voltage adjust implant on said semiconductor layer by doping said semiconductor layer.

13. The process of claim 12 wherein said voltage adjust implant dopes said semiconductor layer with an N-type dopant at a dose of ions/cm$^2$, said step h) dopes said semiconductor layer with a P-type dopant at a dose of 5.0E14 ions/cm$^2$, and said step j) dopes said semiconductor layer with a P-type dopant at a dose of 5.0E12 ions/cm$^2$.

14. The process of claim 10, further comprising the step of removing said etch mask between steps i) and j).

15. The process of claim 14, further comprising the step of removing said implant masking layer after step j).

16. The process of claim 15, wherein said implant masking layer comprises plasma oxide having a thickness of 2000 Å.

17. The process of claim 10 wherein said step i) comprises the use of hydrofluoric acid as an etchant to undercut said etch mask.

18. The process of claim 10 wherein said step i) comprises the use of a plasma as an etchant to undercut said etch mask.

19. A process for forming an inverted lightly doped drain thin film transistor for a static random access memory device, comprising the following steps:
a) forming a first oxide layer over a semiconductor support layer;
b) forming a transistor gate of doped polycrystalline silicon over said first oxide layer;
c) forming a second oxide layer over said transistor gale;
d) forming a polycrystalline silicon layer over said second oxide layer;
e) forming a third oxide layer over said polycrystalline silicon layer, said third oxide layer having a thickness of at least 2000 Å;
f) forming an etch mask layer over said transistor gate and over a portion of said third oxide layer, thereby covering portions of said third oxide layer and leaving portions of said third oxide layer exposed;
g) removing said exposed portions of said third oxide layer thereby leaving portions of said polycrystalline silicon layer exposed;
h) doping said exposed portions of said polycrystalline silicon layer with a P-type dopant at a dose of 5.0E14 ions/cm$^2$;
i) undercutting said etch mask layer to remove portions of said third oxide layer, said undercutting further exposing said polycrystalline layer;
j) removing said etch mask; and
k) doping said polycrystalline silicon layer exposed during step i), with an N-type dopant at a dose of 5.0E12 ions/cm$^2$;

thereby forming a transistor source, a transistor drain, and a transistor channel in said polycrystalline silicon layer.

20. The process of claim 19 wherein steps g) and i) are performed during a single etch step.

21. The process of claim 19 wherein step i) comprises the use of hydrofluoric acid as an etchant to undercut said etch mask.

22. The process of claim 19 wherein step i) comprises the use of a oxide-selective plasma as an etchant to undercut said etch mask.

23. The process of claim 19 further comprising the step of adjusting a threshold voltage of said polycrystalline silicon layer by doping said polycrystalline silicon layer with an P-type dopant at a dose of 4.6E12 ions/cm$^2$.

24. The process of claim 1, further comprising the step removing said implant masking layer after step j).

25. The process of claim 10, further comprising the step of removing said implant making layer after step j).

26. The process of claim 19, further comprising the step of removing said third oxide layer after step k).

* * * * *

UNITED STATES PATENT AND TRADEMARK OFFICE
CERTIFICATE OF CORRECTION

Patent No.: 5,385,854

Dated: January 31, 1995

Inventor(s): Shubneesh Batra, Monte Manning

It is certified that error appears in the above-mentioned patent and that said Letters Patent is hereby corrected as shown below:

Column 1, line 1, please insert:

-- This invention was made with Government support under Contract No. MDA972-92-C-0054 awarded by Advanced Research Projects Agency (ARPA). The Government has certain rights in this invention. --

Signed and Sealed this

Ninth Day of May, 1995

Attest:

BRUCE LEHMAN

*Attesting Officer*     *Commissioner of Patents and Trademarks*